(12) United States Patent
Knyazik et al.

(10) Patent No.: US 9,312,104 B2
(45) Date of Patent: Apr. 12, 2016

(54) COIL ANTENNA WITH PLURAL RADIAL LOBES

(71) Applicant: APPLIED MATERIALS, INC., Santa Clara, CA (US)

(72) Inventors: Vladimir Knyazik, Palo Alto, CA (US); Samer Banna, San Jose, CA (US); Kyle R. Tantiwong, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 184 days.

(21) Appl. No.: 14/107,137

(22) Filed: Dec. 16, 2013

(65) Prior Publication Data

US 2015/0097478 A1    Apr. 9, 2015

Related U.S. Application Data

(60) Provisional application No. 61/886,845, filed on Oct. 4, 2013.

(51) Int. Cl.
*H01Q 1/26* (2006.01)
*H01J 37/32* (2006.01)

(52) U.S. Cl.
CPC .................................. *H01J 37/3211* (2013.01)

(58) Field of Classification Search
USPC .......................................... 315/111.21–11.81
See application file for complete search history.

(56) References Cited

U.S. PATENT DOCUMENTS

| 3,372,394 | A | * | 3/1968 | Kaufman | H01Q 3/44 343/701 |
| 4,785,303 | A | * | 11/1988 | Clark | H01Q 21/205 343/742 |
| 6,652,712 | B2 | * | 11/2003 | Wang | H01J 37/321 118/723 I |
| 6,673,199 | B1 | * | 1/2004 | Yamartino | H01J 37/321 118/723 E |
| 2001/0045262 | A1 | * | 11/2001 | Gujer | C23C 16/4401 156/345.51 |
| 2004/0083971 | A1 | | 5/2004 | Holland et al. | |
| 2012/0037491 | A1 | | 2/2012 | Park et al. | |
| 2012/0248978 | A1 | * | 10/2012 | Howald | H01J 37/32183 315/34 |

FOREIGN PATENT DOCUMENTS

JP    2002100615 A    4/2002
JP    2011103346 A    5/2011

OTHER PUBLICATIONS

U.S. Appl. No. 14/107,184, filed Dec. 16, 2013, Knyazik et al.

* cited by examiner

*Primary Examiner* — Douglas W Owens
*Assistant Examiner* — Srinivas Sathiraju
(74) *Attorney, Agent, or Firm* — Robert M. Wallace

(57) ABSTRACT

A low inductance coil antenna for a plasma reactor has plural conductor lobes extending radially from respective RF supply connections.

20 Claims, 12 Drawing Sheets

COIL ANTENNA WITH PLURAL RADIAL LOBES

CROSS-REFERENCE TO RELATED APPLICATIONS

This application claims benefit of U.S. Provisional Application Ser. No. 61/886,845 filed Oct. 4, 2013 entitled PLASMA REACTOR WITH A COIL ANTENNA OF PLURAL COIL LOBES RADIATING FROM A CIRCULAR RF POWER TERMINAL, by Vladimir Knyazik, et al., and assigned to the present assignee.

BACKGROUND

1. Technical Field

An inductively coupled plasma source of a plasma reactor generally includes an antenna having plural conductive coils and an RF power generator coupled to the antenna.

2. Background Discussion

An inductively coupled plasma source is employed in many plasma reactors for performing plasma-enhanced processes, such as etching, on a workpiece such as a semiconductor wafer. An inductively coupled plasma source includes one or more RF-driven inductive coils to deliver power to a plasma. The coil antenna may include two or more coils in order to control radial distribution of plasma ion density. A typical coil antenna may be a flat spiral conductor or a cylindrically shaped spiral winding. The inductance of such a coil antenna is typically very high, causing the voltage on the RF power terminal of the coil antenna to be very high. As a result, it is often necessary to connect a capacitor in series with the coil antenna in order to reduce the voltage on the RF power terminal. One problem is that the introduction of such a series capacitor reduces the efficiency of the coil antenna.

Another problem with a typical inductively coupled plasma source is that the use of two or more coils in the antenna creates an M-shaped radial distribution of plasma ion density, in which there are pronounced minima at the wafer edge and at the wafer center. This problem arises from interaction or mutual coupling between the different coils of the antenna.

SUMMARY

A coil antenna comprises plural conductive lobes arranged with respect to a central axis, each of the conductive lobes comprising an elongate conductor having a first end and a second end, the plural conductive lobes having respective radial axes distributed azimuthally about the central axis. The coil antenna further comprises a first connection to the first ends of the plural conductive lobes and a second connection to the second ends of the plural conductive lobes, the first and second connections being adapted for coupling to an RF power source.

In one embodiment, each of the first and second ends faces radially inwardly. In an embodiment, the elongate conductor of each of the plural conductive lobes follows a looped path.

In an embodiment, adjacent ones of the plural conductive lobes at least partially overlie one another without contacting one another. In a related embodiment, each of the lobes defines an enclosed an area, and the enclosed areas of adjacent ones of the lobes at least partially overlap one another to define overlapping areas. In a further related embodiment, the overlapping areas vary as a function of radial location.

In accordance with an embodiment, the coil antenna further comprises respective variable capacitors connected in series between respective ones of the elongate conductors and one of the first and second connections, and a controller adapted to govern the respective variable capacitors.

In another embodiments, the coil antenna further comprises respective variable capacitors connected in series between sections of respective ones of the elongate conductors, and a controller adapted to govern the respective variable capacitors.

In one embodiment, the first and second connections comprise a pair of conductive rings around the central axis and displaced from one another along the central axis by a gap distance. In a related embodiment, the elongate conductor of each of the plural conductive lobes has a thickness along the central axis less than the gap distance.

In accordance with a further aspect, a coil antenna for use in a plasma reactor having a central axis comprises: (a) plural conductive lobes, each of the conductive lobes comprising an elongate conductor having a pair of ends, the plural conductive lobes having respective radial axes distributed azimuthally about the central axis; and (b) a pair of connection elements displaced from one another along the axis of symmetry by a gap distance, respective ones of the pair of ends being coupled to respective ones of the pair of connection elements. The pair of connection elements is adapted to receive RF power.

In an embodiment, each of the pair of ends faces radially inwardly. In an embodiment, the elongate conductor of each of the plural conductive lobes has a thickness along the axis of symmetry less than the gap distance. In a related embodiment, adjacent ones of the plural conductive lobes at least partially overlie one another without contacting one another. In a further related embodiment, areas of adjacent conductive lobes overlap one another, and the proportion of overlapping areas to total area varies as a function of radial location. In one embodiment, the function compensates for a predetermined nonuniformity in radial distribution of plasma ion density in the plasma reactor.

In accordance with an embodiment, respective variable capacitors are connected in series with between respective sections of the elongate conductors, and a controller is adapted to govern the respective variable capacitors.

In accordance with another embodiment, respective variable capacitors connected in series between respective ones of the elongate conductors and one of the pair of connection elements, and a controller is adapted to govern the respective variable capacitors.

In accordance with another aspect, a coil antenna comprises plural conductive lobes arranged with respect to a central axis, each of the conductive lobes comprising an elongate conductor having a first end and a second end, the plural conductive lobes having respective radial axes distributed azimuthally about the central axis. The plural conductive lobes are connected in parallel at the first and second ends, the first and second ends being adapted for coupling to an RF power source. In one embodiment, respective variable capacitors are connected in series with between respective ones of the elongate conductors. A controller is adapted to govern the respective variable capacitors.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
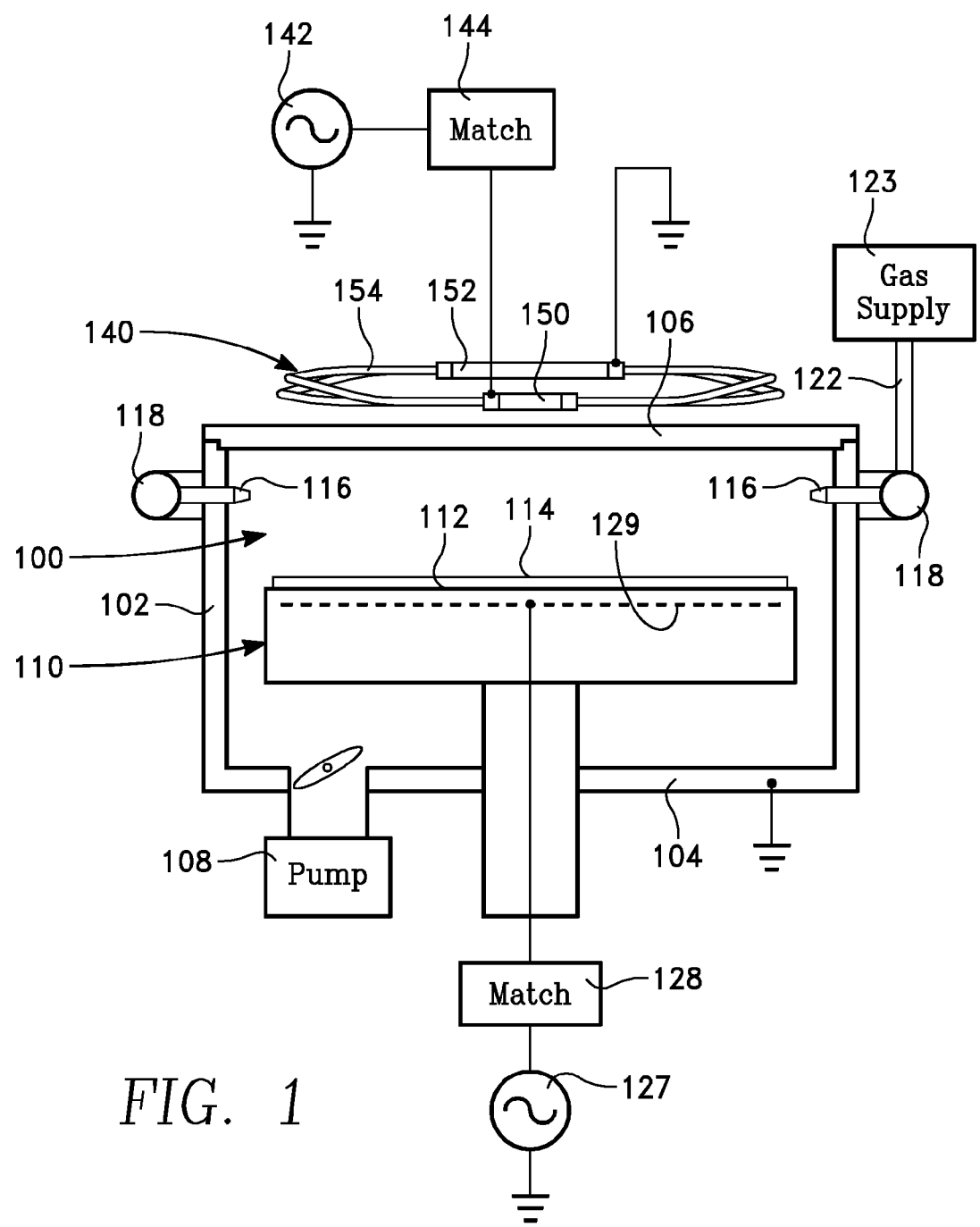
FIG. 1 is an elevational cut-away view of a plasma reactor embodying one aspect.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

FIG. 1 depicts a plasma reactor in accordance with one embodiment. The plasma reactor includes a processing chamber 100 enclosed by a cylindrical side wall 102, a floor 104 and a ceiling 106. A vacuum pump 108 evacuates the processing chamber 100. A workpiece support pedestal 110 within the processing chamber 100 includes a workpiece support surface 112 for holding a workpiece 114 in facing relationship with the ceiling 106. An array of process gas injectors 116 extend into the processing chamber 100 and are coupled to a gas manifold 118. A gas supply conduit 122 is coupled from a process gas supply 123 to the gas manifold 118. Optionally, an RF bias power generator 127 is coupled through an impedance match 128 to an electrode 129 underlying the workpiece support surface 112.

The plasma reactor of FIG. 1 has an inductively coupled plasma source including a coil antenna 140, an RF power generator 142 and an RF impedance match 144 coupled between the RF power generator 142 and the coil antenna 140. In the embodiment of FIG. 1, the coil antenna 140 overlies the ceiling 106. The ceiling 106 is adapted to permit inductive coupling of RF power from the coil antenna 140 into the interior of the processing chamber 100. For example, the ceiling 106 may be formed of a non-conductive material, or of a semiconductor material.

Figure 2:
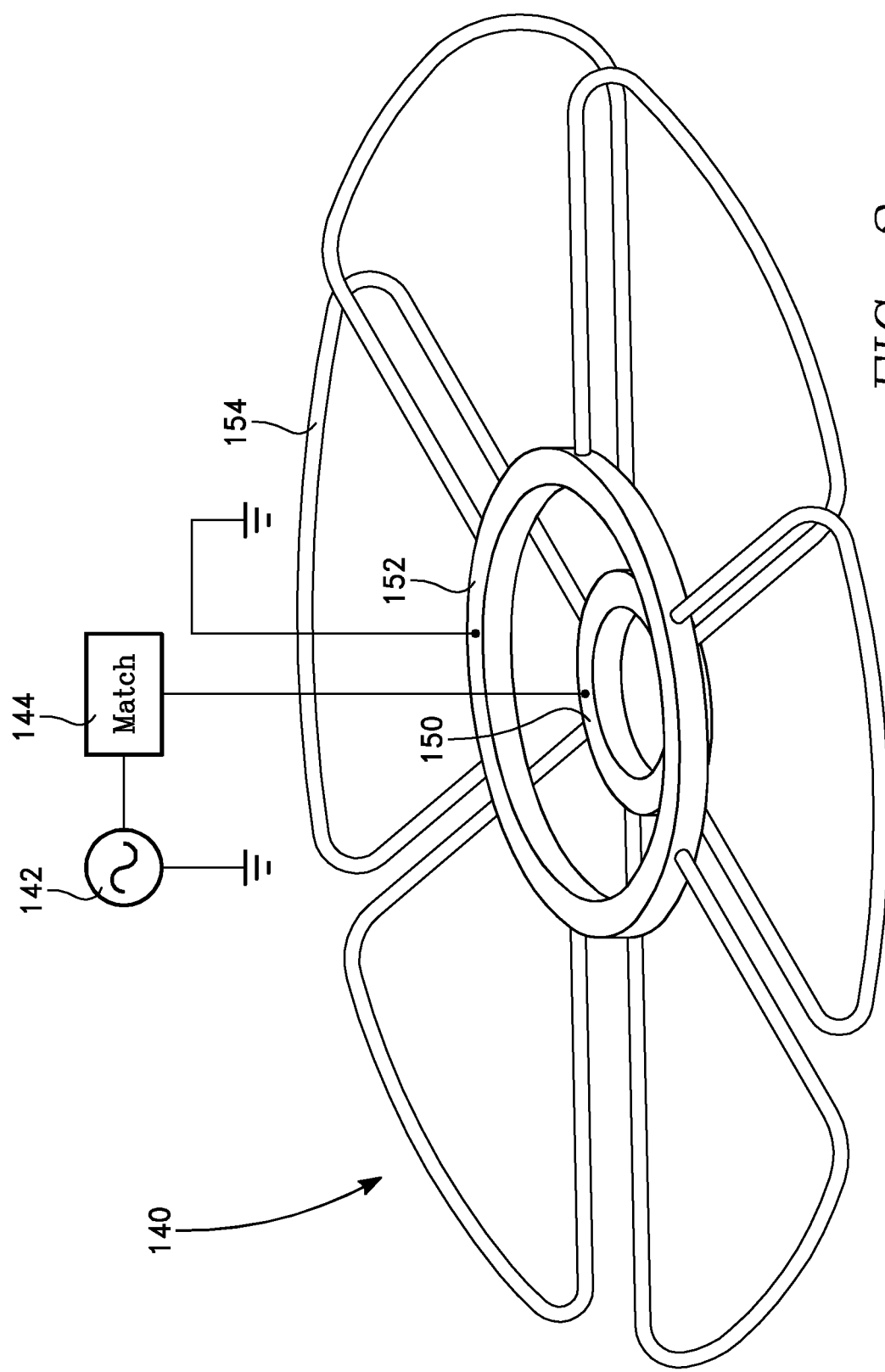
FIG. 2 is an orthographic projection of a coil antenna of the plasma reactor of FIG. 1.
Figure 3:
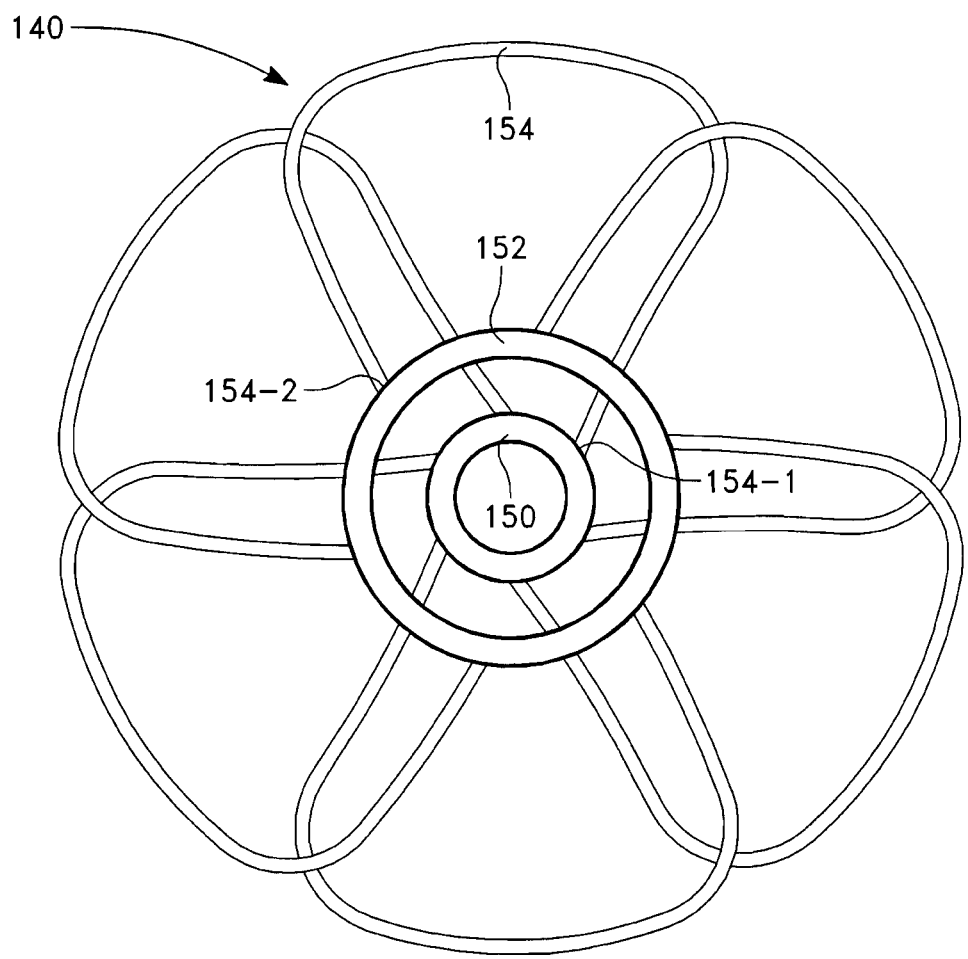
FIG. 3 is a plan view corresponding to FIG. 2.
Figure 4:
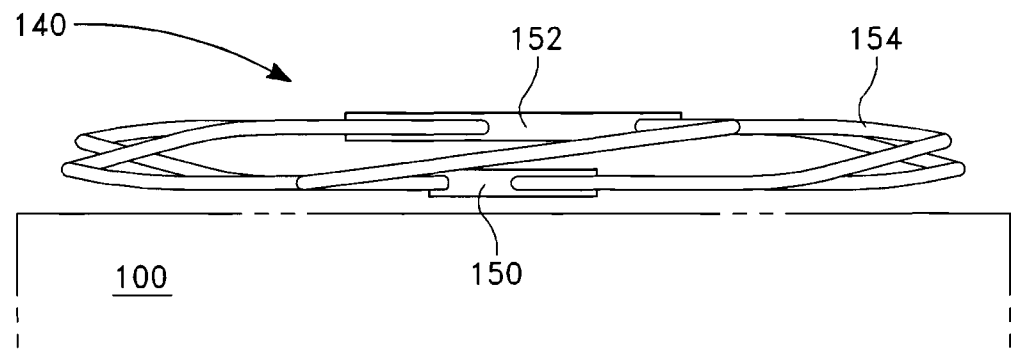
FIG. 4 is an elevational view corresponding to FIG. 2.

The coil antenna 140 has a low inductance, and its structure is best seen in FIGS. 2-4, depicting an RF supply ring 150, an RF return ring 152 and plural conductive lobes 154. The RF supply ring 150 is connected to the RF impedance match 144 and the RF return ring 152 is connected to ground, and are coaxial with one another. Each conductive lobe 154 is an elongate conductor having one end 154a connected to the RF supply ring 150 and its opposite end 154b connected to the RF return ring 152.

Figure 5:
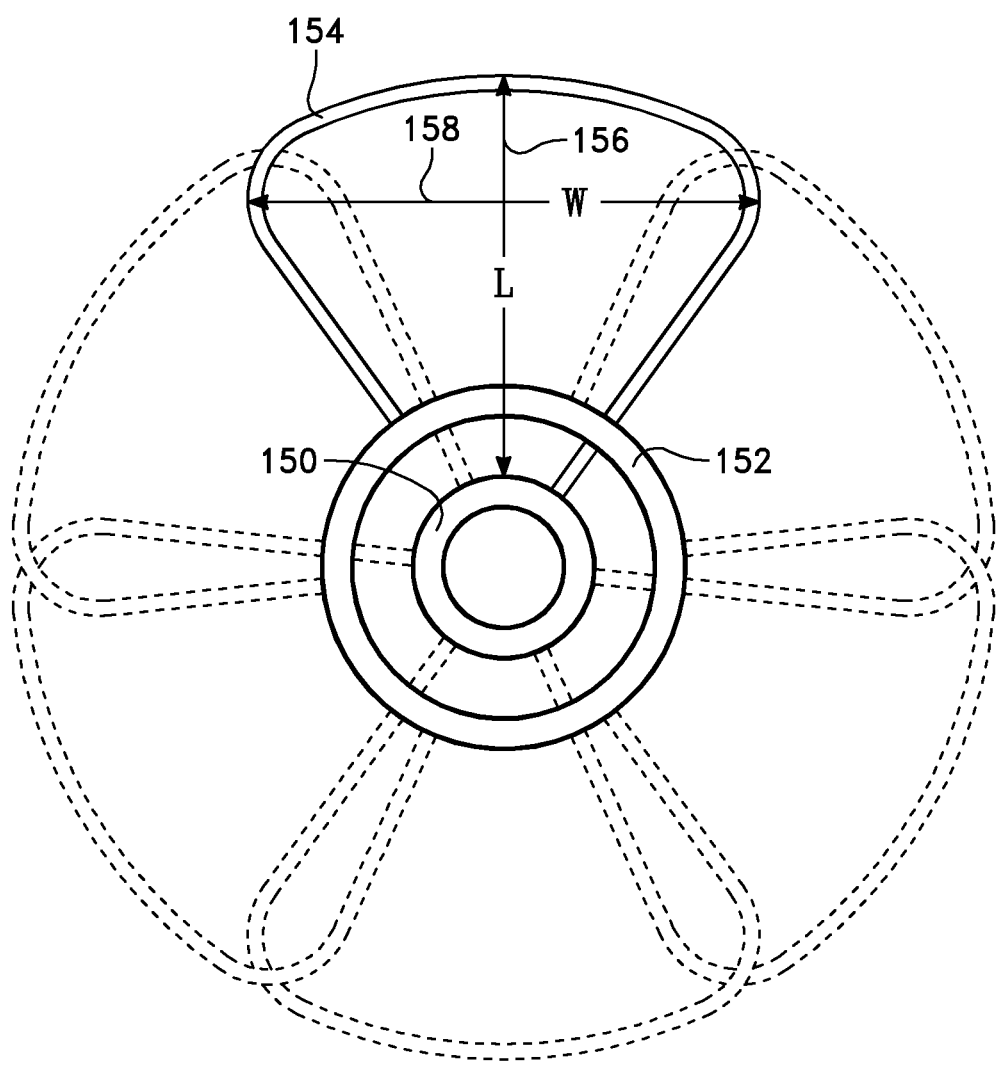
FIG. 5 is a plan view corresponding to FIG. 3 illustrating certain geometrical parameters of the coil antenna.

Referring to FIG. 5, each conductive lobe 154 has a major axis 156 lying in a radial direction and a minor axis 158 orthogonal to the major axis 156. The major axis, in one embodiment, intersects an axis of symmetry of the RF supply ring 150. In the embodiment of FIGS. 2-4 there are six conductive lobes 154, although any suitable number may be employed. The major axes 156 of the conductive lobes 154 are oriented at uniformly spaced angles about the axis of symmetry of the RF supply ring 150, in one embodiment. The length L of each conductive lobe 154 along its major axis 156 corresponds to the diameter of the coil antenna 140. The width W of each conductive lobe 154 along its minor axis 158 varies as a predetermined function of position along the major axis 156. The predetermined function controls the overlapping of areas enclosed by adjacent conductive lobes. This overlapping can vary with radial position. For minimum inductance, such overlapping is minimized. In order to increase plasma ion density in chosen radial locations, the overlap between adjacent conductive lobes is increased in the chosen locations and minimized in others.

In the embodiment of FIGS. 2-4, the RF supply ring 150 and the RF return ring 152 are placed at different locations along the axis of symmetry, so as to be separated by a gap. For example, the RF supply ring 150 is closer to the ceiling 106 than the RF return ring 152. The gap between the RF supply ring 150 and the RF return ring 152 exceeds the thickness along the axis of symmetry of each conductive lobe 154. This feature can permit neighboring ones of the conductive lobes 154 to overlap one another without contacting each other. In the embodiment illustrated in FIGS. 2-4, the RF supply ring 150 is of a smaller diameter than the RF return ring 152. In another embodiment, this arrangement may be reversed, so that the RF supply ring 150 may be of a larger diameter than the RF return ring 152.

Figure 5A:
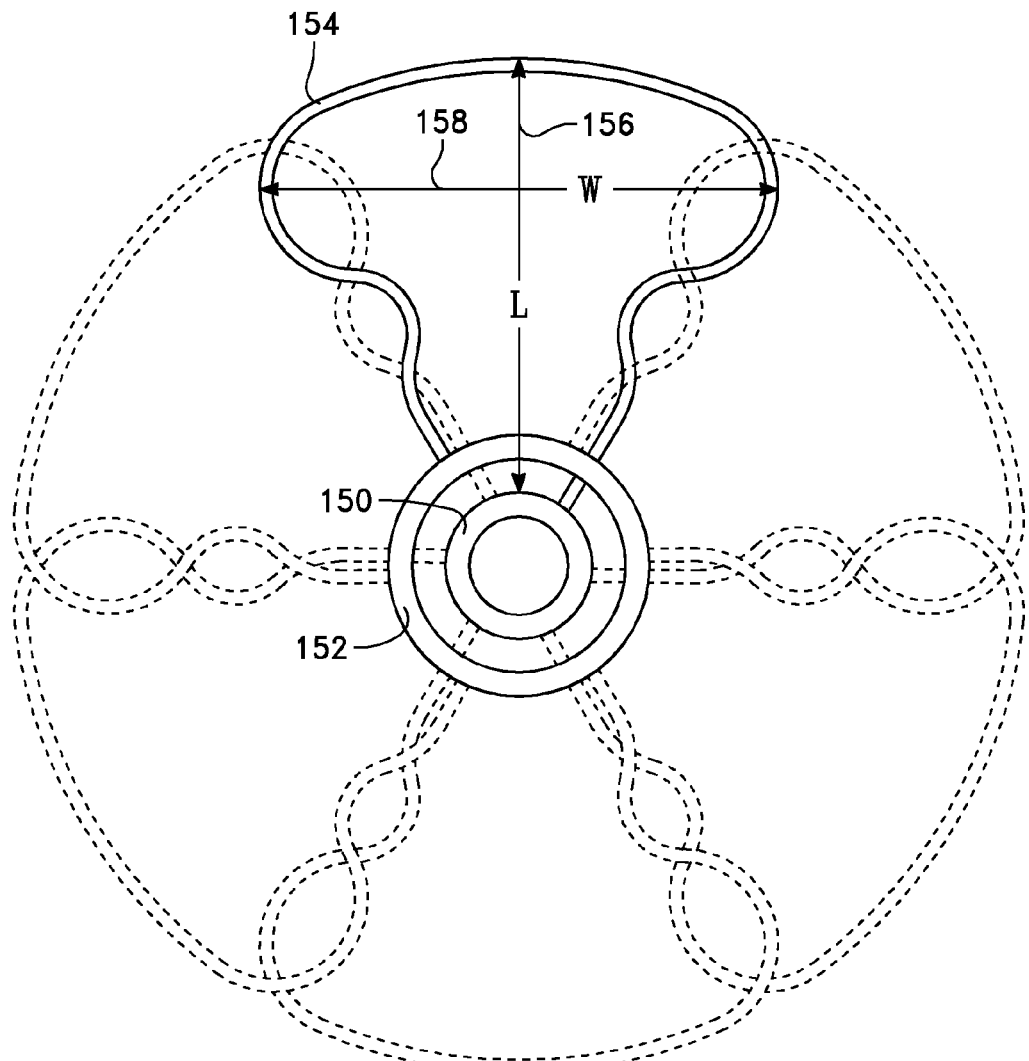
FIG. 5A depicts a modification of the embodiment of FIG. 5.
Figure 6A:
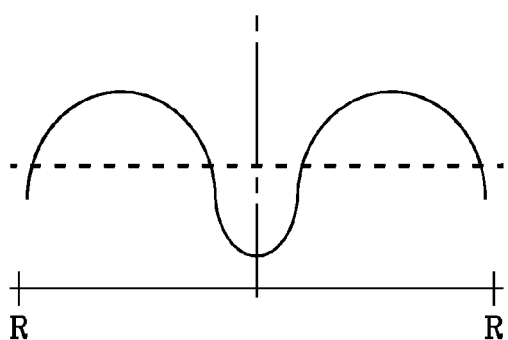
FIG. 6A is as graph depicting an M-shaped radial distribution of plasma ion density (solid line) and a corrected distribution of plasma ion density (dashed line).
Figure 6B:
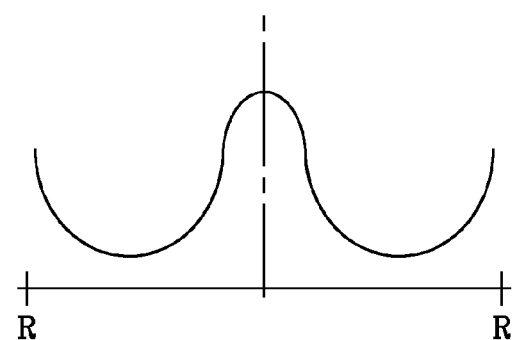
FIG. 6B is a graph depicting proportion of overlap between adjacent conductor lobes as a function of radial location, for transforming the solid line distribution of FIG. 6A to the dashed line distribution of FIG. 6A.

An example is graphically illustrated in FIGS. 6A and 6B. FIG. 6A depicts radial distribution of plasma ion energy (solid line), having an M-shaped non-uniformity. FIG. 6B depicts the proportion of overlapping areas of adjacent conductive lobes 154 as a function of radial position. In FIG. 6B, the function or radial distribution of the overlap corresponds to an inverse of the M-shaped non-uniformity of FIG. 6A. The overlap distribution or function of FIG. 6B compensates for (or nearly eliminates) the M-shaped non-uniformity of FIG. 6A, resulting in a uniform distribution (dashed line of FIG. 6A). FIG. 5A depicts one example of how the conductive lobes 154 may be shaped to maximize overlap between adjacent conductive lobes at the center and edge of the circular zone of the coil antenna 140 and to minimize the overlap in an intermediate zone between the center and edge.

Figure 7:
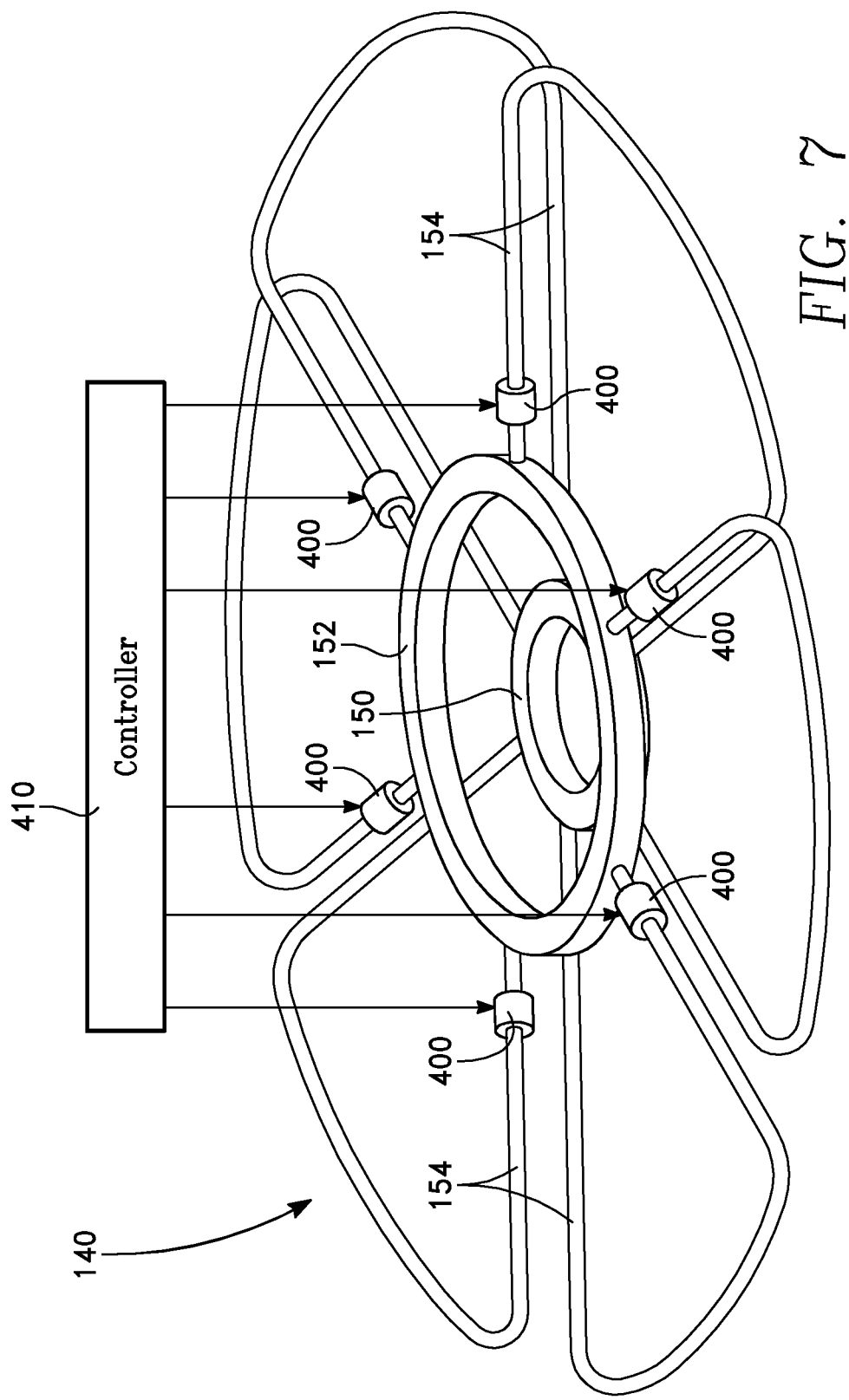
FIG. 7 illustrates a further embodiment.

As depicted in FIG. 7, variable capacitors 400 may be individually connected in series between the respective conductive lobes 154 and the RF return ring 152. Alternatively, the variable capacitors 400 may be individually connected in series between the respective conductive lobes 154 and the RF supply ring 150. As a further alternative, each conductive lobe 154 may be divided into two sections at a break, and each variable capacitor may be connected in series between the two sections of the respective conductive lobe 154. A controller 410 governs variable capacitors 400 independently. By changing the individual capacitances of the variable capacitors 400, the circumferential (e.g., azimuthal) distribution of RF power may be selectively adjusted.

Figure 8:
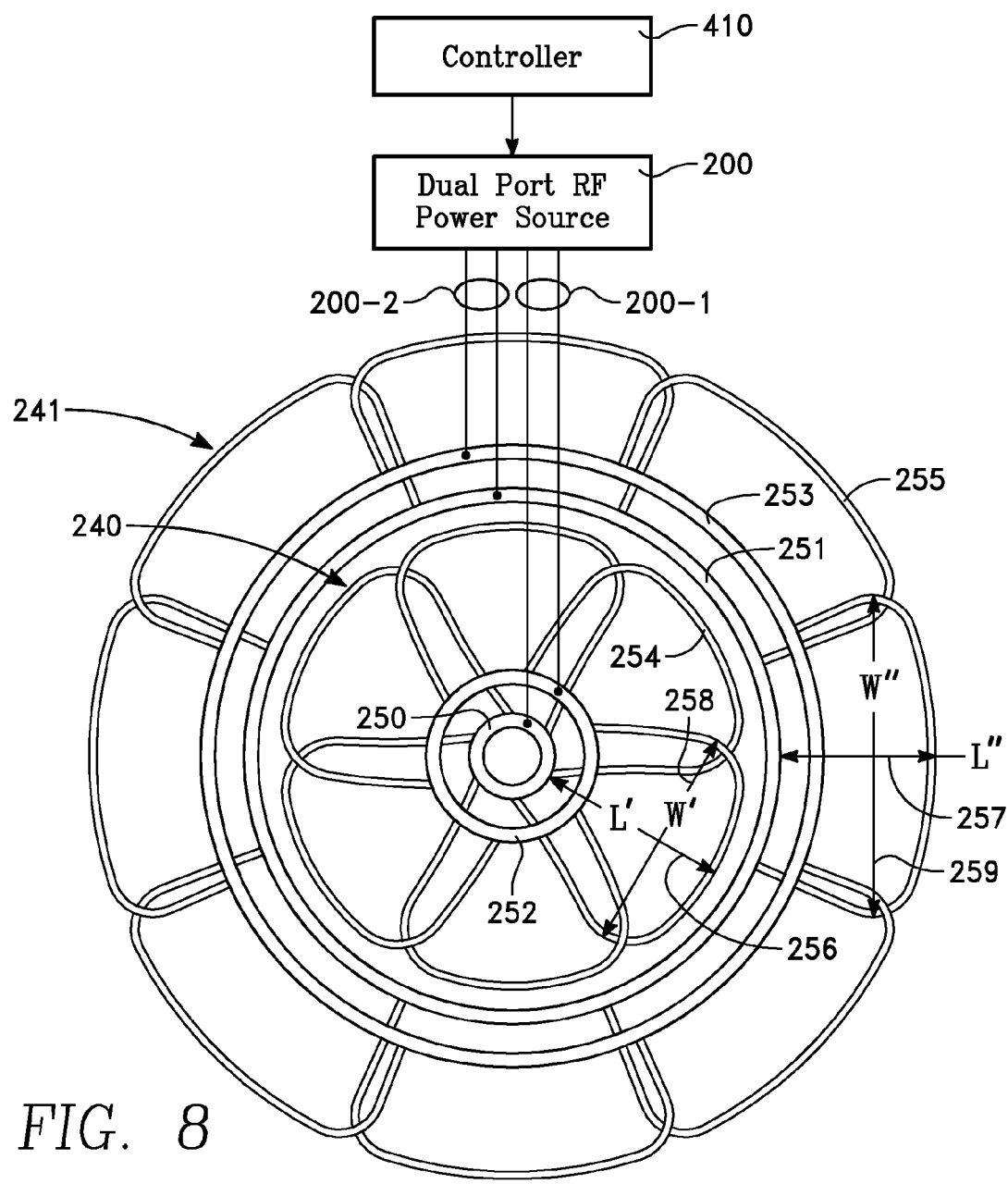
FIG. 8 is a plan view of an embodiment having two independent radial zones.
Figure 9:
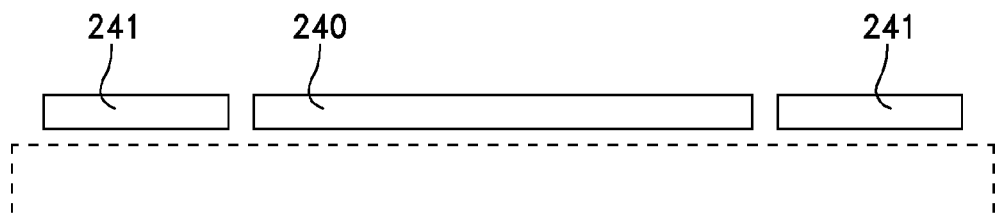
FIG. 9 is an elevational view corresponding to FIG. 8.
Figure 10:
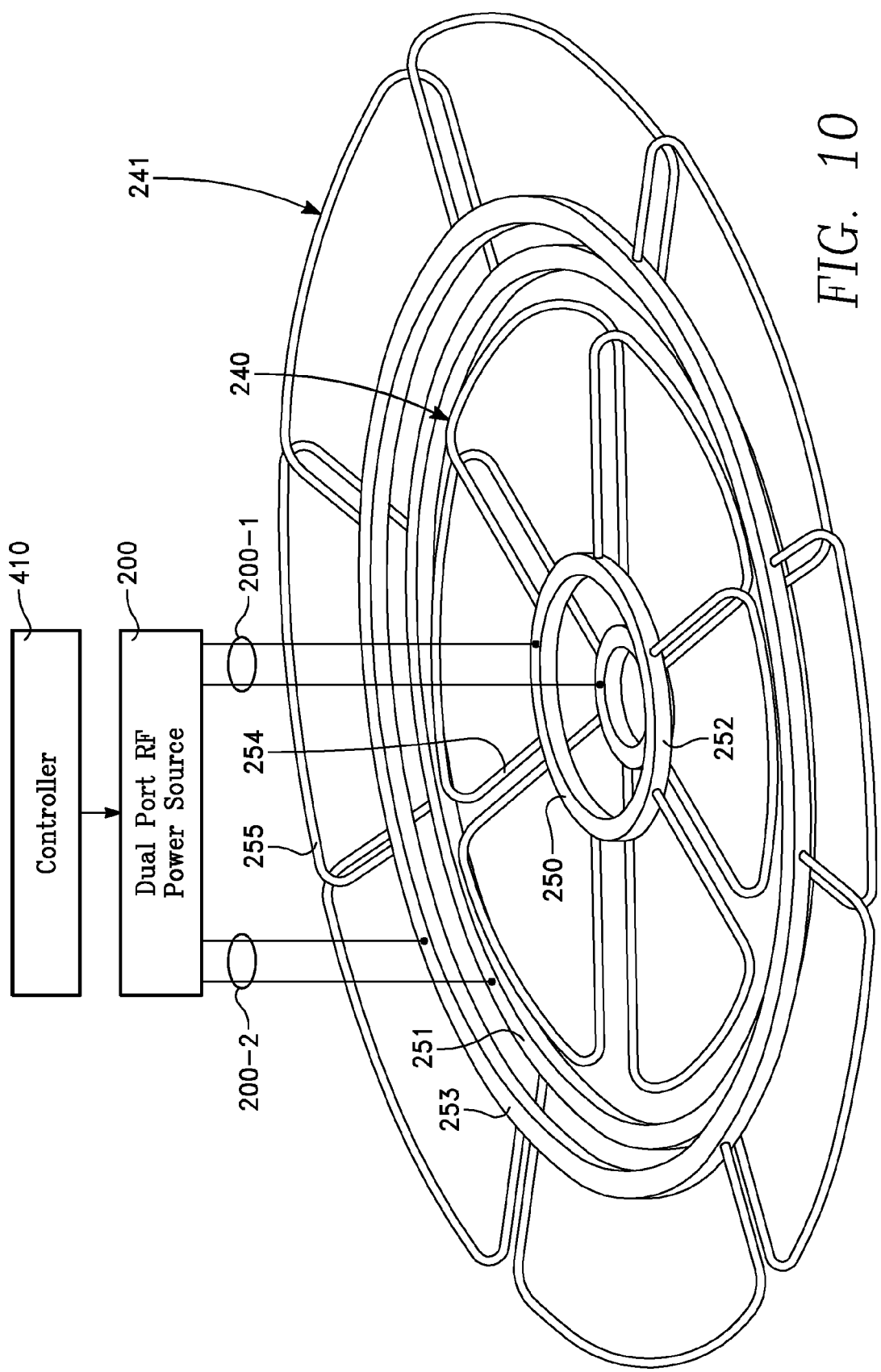
FIG. 10 is an orthographic projection corresponding to FIG. 8.

FIGS. 8, 9 and 10 illustrate a low inductance coil antenna having concentric zones, including an inner antenna 240 and an outer antenna 241 surrounding the inner antenna 240. A dual port RF power source 200 is governed by a controller 410 to provide separate control of the ratio of RF power levels applied to the inner and outer antennas 240 and 241. This ratio affects radial distribution of plasma ion density over a workpiece underlying the coil antenna.

The inner antenna 240 of FIGS. 8-10 includes an inner RF supply ring 250, an inner RF return ring 252 and plural inner conductive lobes 254. The inner RF supply ring 250 and the inner RF return ring 252 are connected across a first output port 200-1 of the dual port RF power source 200. The inner RF supply ring 250 and the inner RF return ring 252 may be coaxial with one another in one embodiment. Each inner conductive lobe 254 is an elongate conductor having one end connected to the inner RF supply ring 250 and its opposite end connected to the inner RF return ring 252.

Each inner conductive lobe 254 has a major axis 256 lying in a radial direction and a minor axis 258 orthogonal to the major axis 256. The major axis 256, in one embodiment, intersects an axis of symmetry of the inner RF supply ring 250. In the embodiment of FIGS. 8-9 there are six inner conductive lobes 254, although any suitable number may be employed. The major axes 256 of the inner conductive lobes 254 are oriented at uniformly spaced angles about the axis of symmetry of the inner RF supply ring 250, in one embodiment. The length L' of each inner conductive lobe 254 along its major axis 256 corresponds to the diameter of the inner coil antenna 240. The width W' of each inner conductive lobe 254 along its minor axis 258 varies as a predetermined function of radial position (i.e., position along the major axis 256). The predetermined function controls the extent to which areas enclosed by adjacent inner conductive lobes 254 overlap. For minimum inductance, such overlapping is minimized. In order to increase plasma ion density in chosen locations, the overlap between adjacent inner conductive lobes is increased in the chosen locations and minimized in others.

In the embodiment of FIGS. 8-10, the inner RF supply ring 250 and the inner RF return ring 252 are placed at different locations along the axis of symmetry, so as to be separated by a gap. For example, the inner RF supply ring 250 is closer to the ceiling 106 than the inner RF return ring 252. The gap between the inner RF supply ring 250 and the inner RF return ring 252 exceeds the thickness along the axis of symmetry of each inner conductive lobe 254. This feature can permit neighboring ones of the inner conductive lobes 254 to overlap one another without contacting each other. In the embodiment illustrated in FIGS. 8-10, the inner RF supply ring 250 is of a smaller diameter than the inner RF return ring 252. In another embodiment, this arrangement may be reversed, so that the inner RF supply ring 250 may be of a larger diameter than the inner RF return ring 252.

The outer antenna 241 of FIGS. 8-10 includes an outer RF supply ring 251, an outer RF return ring 253 and plural outer conductive lobes 255. The radius of the outer RF supply ring 251 and the radius of the outer RF return ring 253 exceed the length L' of each inner conductive lobe 254, so that the outer rings 251, 253 surround the inner antenna 240. The inner conductive lobes 254 define a circular inner antenna zone while the outer conductive lobes 255 define an annular outer antenna zone.

The outer RF supply ring 251 and the outer RF return ring 253 are connected across a second output port 200-2 of the dual port RF power source 200. In one embodiment, the outer RF supply ring 251 and the outer RF return ring 253 are coaxial with one another. Each outer conductive lobe 255 is an elongate conductor having one end connected to the outer RF supply ring 251 and its opposite end connected to the outer RF return ring 253.

Each outer conductive lobe 255 has a major axis 257 lying in a radial direction and a minor axis 259 orthogonal to the major axis 257. The major axis 257, in one embodiment, intersects an axis of symmetry of the outer RF supply ring 251. In the embodiment of FIGS. 8-9, there are eight outer conductive lobes 255 although any suitable number may be employed. The major axes 257 of the outer conductive lobes 255 are oriented at uniformly spaced angles about the axis of symmetry of the outer RF supply ring 251, in one embodiment. The length L" of each outer conductive lobe 255 along its major axis 257 corresponds to the outer diameter of the outer antenna 241. The width W" of each outer conductive lobe 255 along its minor axis 259 varies as a predetermined function of radial position (i.e., position along the major axis 257). The predetermined function controls the extent to which areas enclosed by adjacent outer conductive lobes 255 overlap. For minimum inductance, such overlapping is minimized. In order to increase plasma ion density in chosen locations, the overlap between adjacent inner conductive lobes is increased in the chosen locations and minimized in others.

In the embodiment of FIGS. 8-10, the outer RF supply ring 251 and the outer RF return ring 253 are placed at different locations along the axis of symmetry, so as to be separated by a gap. For example, the outer RF supply ring 251 is closer to the ceiling 106 than the outer RF return ring 253. The gap between the outer RF supply ring 251 and the outer RF return ring 253 exceeds the thickness along the axis of symmetry of each outer conductive lobe 255. This feature can permit neighboring ones of the outer conductive lobes 255 to overlap one another without contacting each other. In the embodiment illustrated in FIGS. 8-10, the outer RF supply ring 251 is of a smaller diameter than the outer RF return ring 253. In another embodiment, this arrangement may be reversed, so that the outer RF supply ring 251 may be of a larger diameter than the outer RF return ring 253.

Figure 8A:
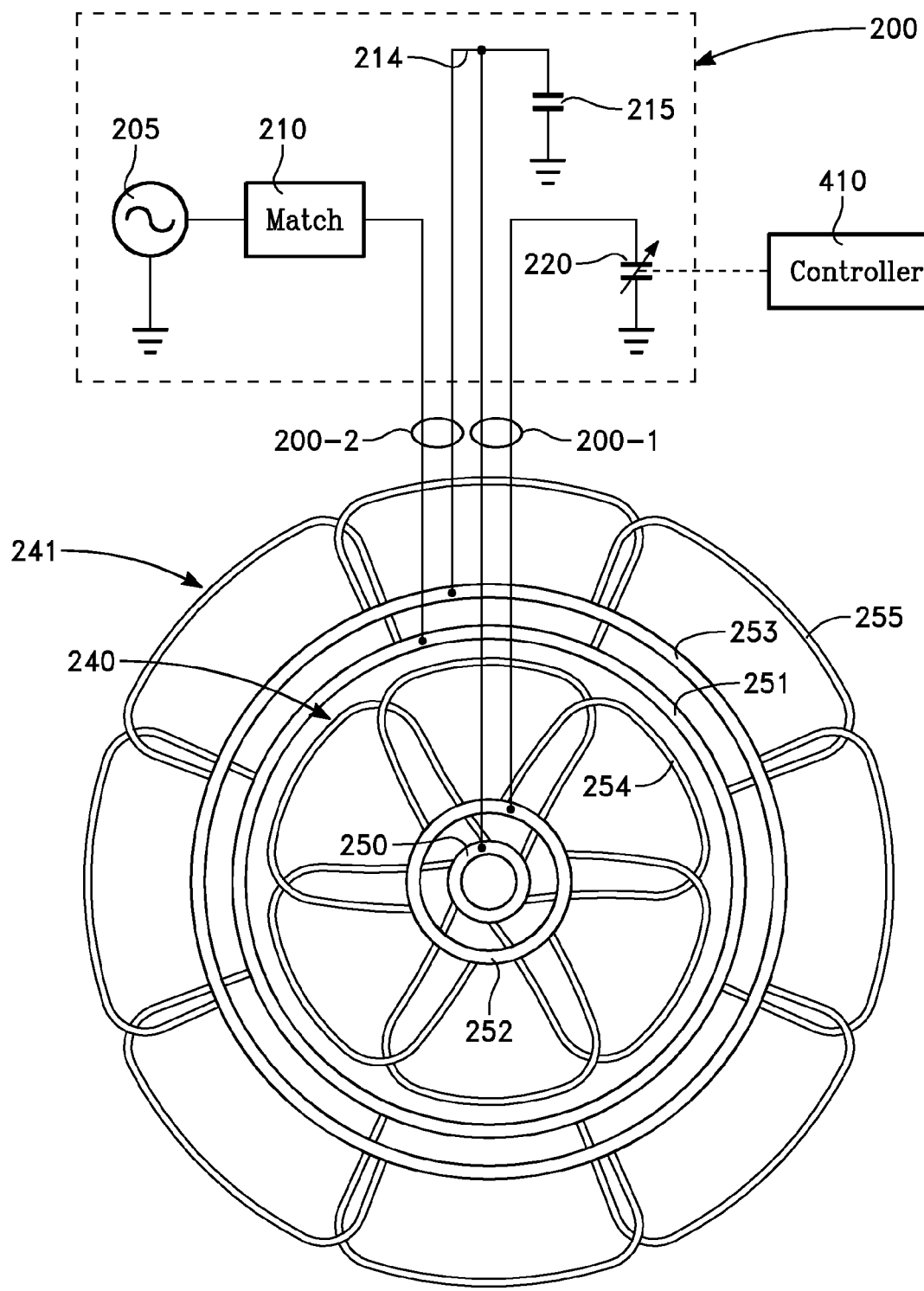
FIG. 8A depicts a first embodiment of a dual port RF power source.

FIG. 8A depicts one embodiment of the dual port RF power source 200, showing its connection to the antenna. The dual port RF power source 200 of FIG. 8A has a single RF power generator 205 coupled through an RF impedance match 210 to the outer RF supply ring 251 of the outer conductive lobe 255. The dual port RF power source 200 includes a junction 214 at which the outer RF return ring 253 and the inner RF supply ring 250 are connected together. A voltage divider capacitor 215 is connected between the junction 214 and ground. A variable capacitor 220 is connected between the inner RF return ring 252 and ground. The controller 410 governs the variable capacitor 220 in order to change or control the ratio of RF power levels applied to the inner and outer antennas 240 and 241, respectively.

Figure 8B:
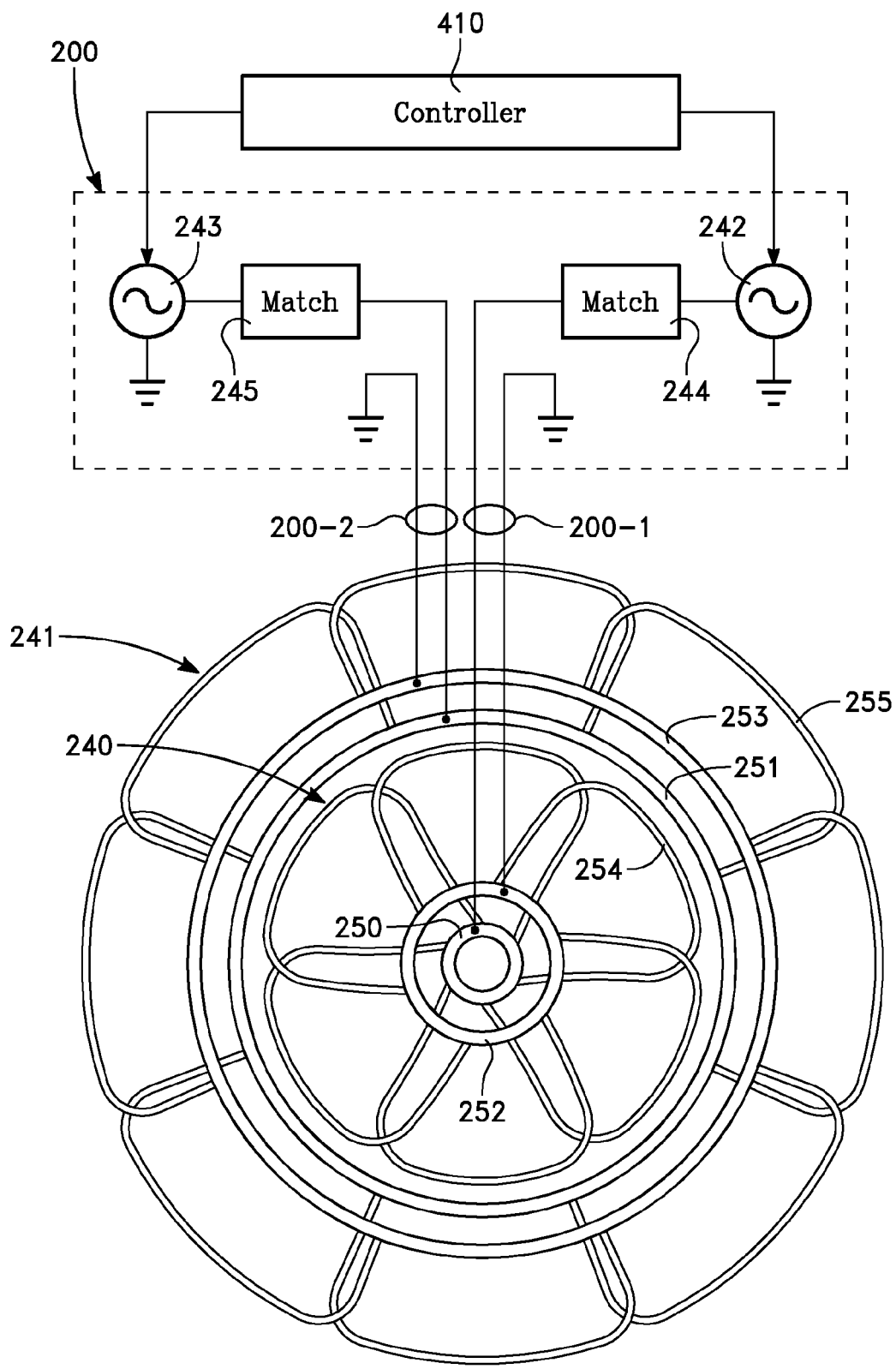
FIG. 8B depicts a second embodiment of a dual port RF power source.

FIG. 8B depicts another embodiment of the dual port RF power source 200. The dual port RF power source 200 of FIG. 8B has a first RF power generator 242 coupled through a first RF impedance match 244 to the inner RF supply ring 250, and a second RF power generator 243 coupled through an RF impedance match 245 to the outer RF supply ring 251. The inner RF return ring 252 and the outer RF return ring 253 are connected to ground. The controller 410 varies the output RF power level of either the RF generator 242 or the RF generator 243 in order to control or change the apportionment of RF power to the inner and outer antennas 240 and 241 respectively. This feature can provide control of radial distribution of plasma ion density.

Figure 11:
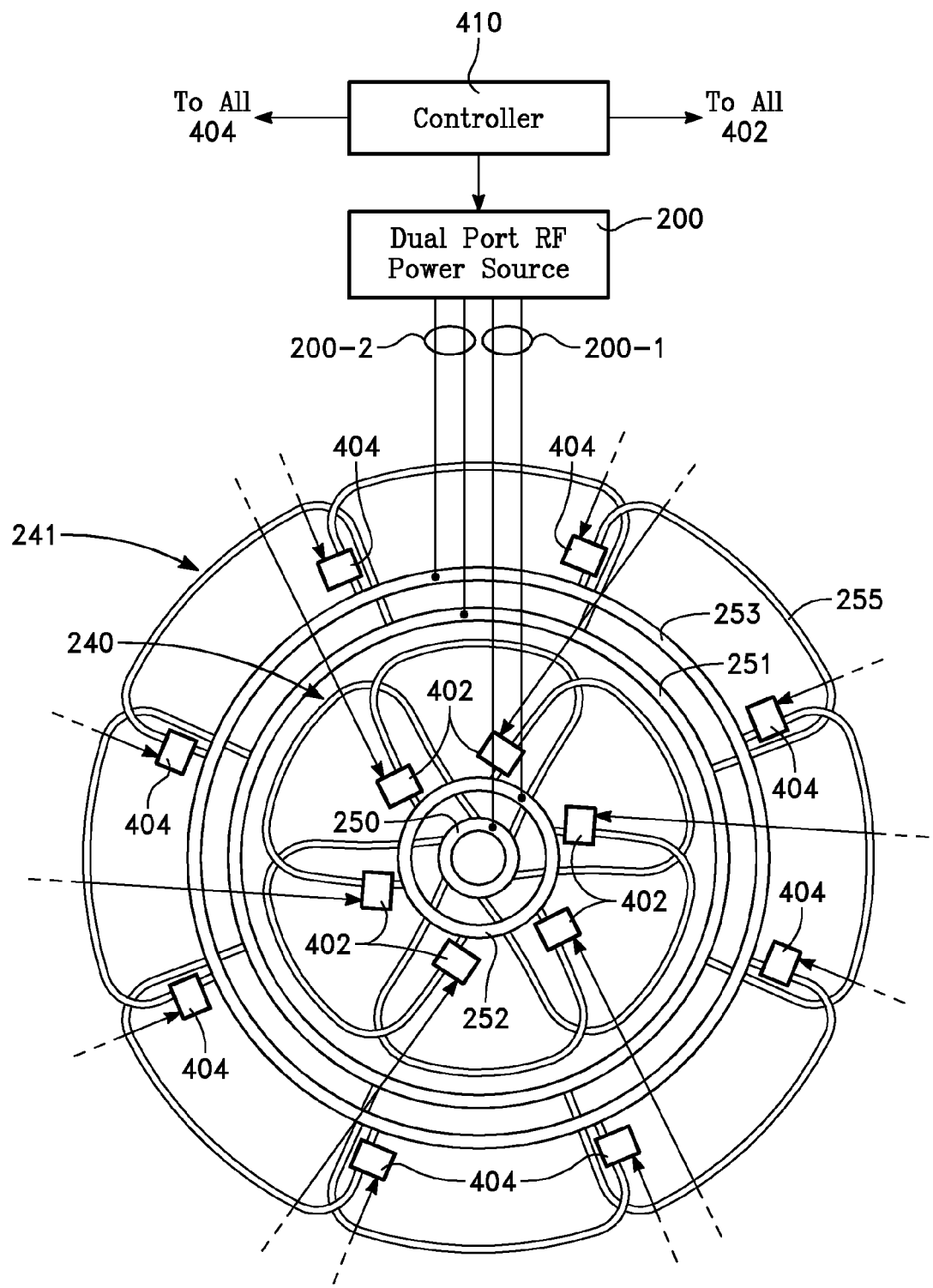
FIG. 11 illustrates a further embodiment corresponding to FIG. 8.

FIG. 11 depicts a modification of the embodiment of FIGS. 8-10, in which variable capacitors 402 are individually connected in series between the respective inner conductive lobes 254 and the inner RF return ring 252, and variable capacitors 404 may be individually connected in series between the respective outer conductive lobes 255 and the outer RF return ring 253. Alternatively, the variable capacitors 402 may be individually connected in series between the respective inner conductive lobes 254 and the inner RF supply ring 250, while the variable capacitors 404 may be individually connected in series between the respective outer conductive lobes 255 and the outer RF supply ring 251. As a further alternative, each inner conductive lobe 254 may be divided into two sections at a break, and each variable capacitor 402 may be connected in series between the two sections of the respective inner conductive lobe 254. Similarly, each outer conductive lobe 255 may be divided into two sections at a break, and each variable capacitor 404 may be connected in series between the two sections of the respective outer conductive lobe 255. The controller 410 governs each of the variable capacitors 402 and 404 independently. By changing the individual capacitances of the variable capacitors 402, the circumferential (e.g., azimuthal) distribution of RF power within the inner concentric zone may be selectively adjusted by the controller 410. By changing the individual capacitances of the variable capacitors 404, the circumferential (e.g., azimuthal) distribution of RF power within the outer concentric zone may be selectively adjusted by the controller 410. The controller 410 may be able to control radial distribution of plasma ion density by adjusting the RF power ratio between the inner and outer antennas 240, 241. At the same time, the controller 410 may control azimuthal distribution of plasma ion density in the inner zone by separately adjusting individual ones of the variable capacitors 402, while controlling azimuthal distribution of plasma ion density in the outer zone by separately adjusting individual ones of the variable capacitors 404.

Figure 12:
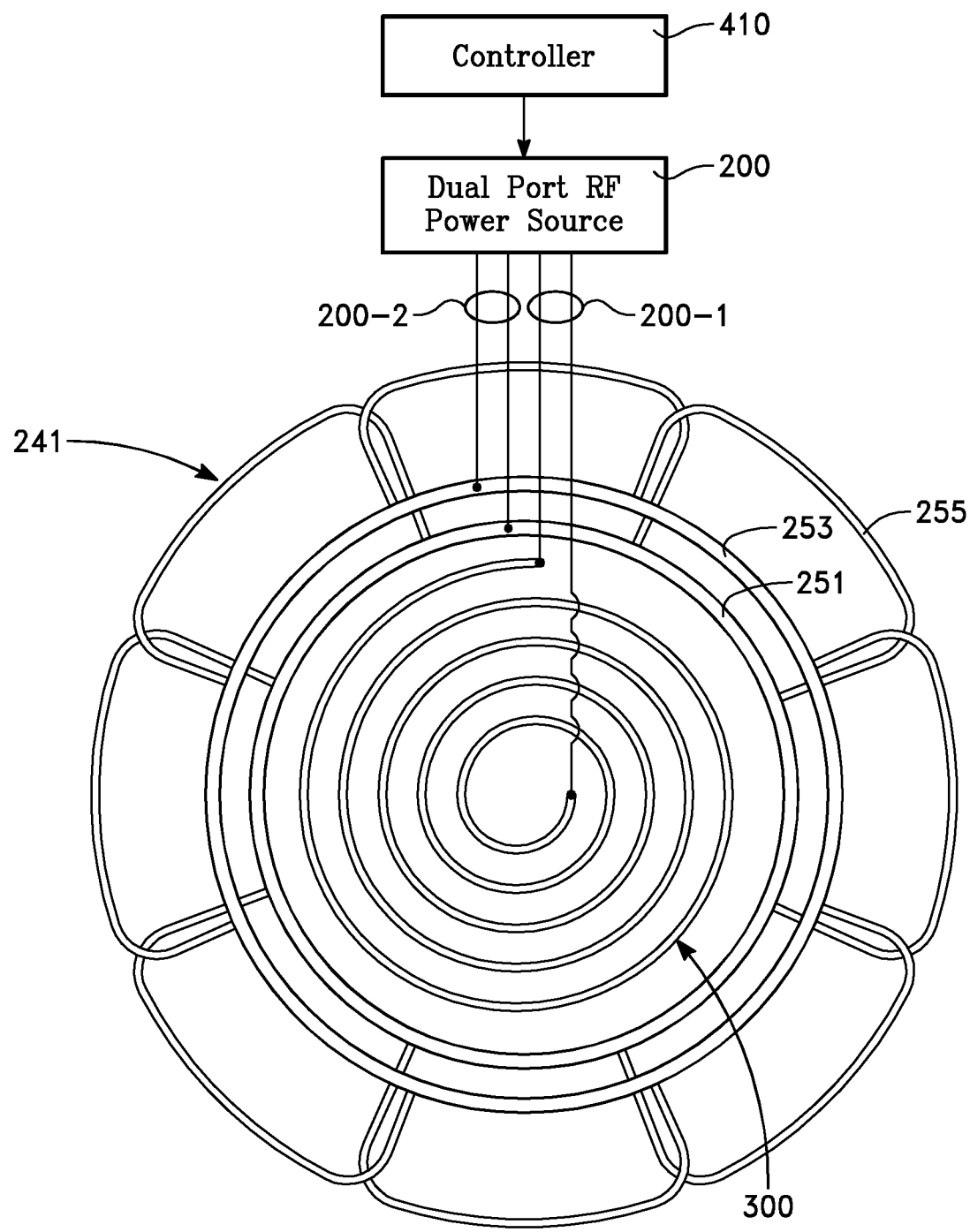
FIG. 12 illustrates a modification of the embodiment of FIG. 8, in which the inner coil is a single winding of a conductor.

FIG. 12 depicts a modification of the embodiment of any one of FIG. 8 or 11, in which a conventional coil antenna 300 replaces the inner coil antenna 240. The conventional coil antenna may include a single conductor wound in a spiral or in a helix. Its size may be relatively small in order to limit inductance.

While the foregoing is directed to embodiments of the present invention, other and further embodiments of the invention may be devised without departing from the basic scope thereof, and the scope thereof is determined by the claims that follow.

What is claimed is:
1. A coil antenna comprising:
plural conductive lobes extending in respective radial directions with respect to a central axis, each of said plural conductive lobes comprising an elongate conductor having a first end and a second end; and
a first connection to the first ends of said plural conductive lobes and a second connection to the second ends of said plural conductive lobes, said first and second connections being adapted for coupling to an RF power source, wherein said first and second connections comprise a pair of conductive rings around said central axis.

2. The coil antenna of claim 1 wherein respective ones of said plural conductive lobes extend radially from respective ones of said first and second ends.

3. The coil antenna of claim 1 wherein the elongate conductor of each of said plural conductive lobes follows a looped path.

4. The coil antenna of claim 1 wherein adjacent ones of said plural conductive lobes at least partially overlie one another without contacting one another.

5. The coil antenna of claim 4 wherein each of said plural conductive lobes defines an enclosed area, and the enclosed areas of adjacent ones of said plural conductive lobes at least partially overlap one another to define overlapping areas.

6. The coil antenna of claim 5 wherein said overlapping areas vary as a function of radial location.

7. The coil antenna of claim 1 further comprising respective variable capacitors connected in series between respective ones of said elongate conductors and one of said first and second connections, and a controller adapted to govern said respective variable capacitors.

8. The coil antenna of claim 1 further comprising respective variable capacitors connected in series between sections of respective ones of said elongate conductors, and a controller adapted to govern said respective variable capacitors.

9. The coil antenna of claim 4 wherein said pair of conductive rings are displaced from one another along said central axis by a gap distance.

10. The coil antenna of claim 9 wherein the elongate conductor of each of said plural conductive lobes has a thickness along said central axis less than said gap distance.

11. A coil antenna for use in a plasma reactor having a central axis, said coil antenna comprising:
(a) plural conductive lobes, each of said plural conductive lobes comprising an elongate conductor having a pair of ends, respective ones of said plural conductive lobes extending radially from respective ones of said first and second ends along respective radial directions;
(b) a pair of connection elements, respective ones of said pair of ends being coupled to respective ones of said pair of connection elements, wherein said pair of connection elements comprise a pair of conductive rings around said central axis; and
(c) wherein said pair of connection elements is adapted to receive RF power.

12. The coil antenna of claim 11 wherein said pair of connection elements are separated by a gap distance along an axial direction.

13. The coil antenna of claim 12 wherein the elongate conductor of each of said plural conductive lobes has a thickness along said central axis less than said gap distance.

14. The coil antenna of claim 13 wherein adjacent ones of said plural conductive lobes at least partially overlie one another without contacting one another.

15. The coil antenna of claim 14 wherein areas of adjacent conductive lobes overlap one another, and a proportion of overlapping areas varies as a function of radial location.

16. The coil antenna of claim 15 wherein said function compensates for a predetermined nonuniformity in radial distribution of plasma ion density in said plasma reactor.

17. The coil antenna of claim 11 further comprising respective variable capacitors connected in series with respective sections of said elongate conductors, and a controller adapted to govern said respective variable capacitors.

18. The coil antenna of claim 14 further comprising respective variable capacitors connected in series between respective ones of said elongate conductors and one of said pair of connection elements, and a controller adapted to govern said respective variable capacitors.

19. A coil antenna comprising:
  plural conductive lobes arranged with respect to a central axis, each of said conductive lobes comprising an elongate conductor having a first end and a second end, said plural conductive lobes extending along respective radial directions distributed about said central axis; and
  a pair of conductive rings around said central axis, said plural conductive lobes being connected in parallel at said first and second ends to said pair of conductive rings, said pair of conductive rings being adapted for coupling to an RF power source.

20. The coil antenna of claim 19 further comprising respective variable capacitors connected in series with respective ones of said elongate conductors, and a controller adapted to govern said respective variable capacitors.

* * * * *